United States Patent

Oomae et al.

(10) Patent No.: US 9,064,993 B2
(45) Date of Patent: Jun. 23, 2015

(54) PHOTOELECTRIC CONVERSION DEVICE AND METHOD OF MANUFACTURING PHOTOELECTRIC CONVERSION DEVICE

(75) Inventors: Satoshi Oomae, Omihachiman (JP); Keita Kurosu, Omihachiman (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 14/113,109

(22) PCT Filed: May 30, 2012

(86) PCT No.: PCT/JP2012/063978
§ 371 (c)(1),
(2), (4) Date: Oct. 21, 2013

(87) PCT Pub. No.: WO2012/165500
PCT Pub. Date: Dec. 6, 2012

(65) Prior Publication Data
US 2014/0042580 A1    Feb. 13, 2014

(30) Foreign Application Priority Data

May 31, 2011   (JP) .................................. 2011-121874

(51) Int. Cl.
*H01L 31/0749*   (2012.01)
*H01L 31/0352*   (2006.01)
*H01L 31/032*    (2006.01)
(Continued)

(52) U.S. Cl.
CPC .... *H01L 31/035272* (2013.01); *H01L 31/0322* (2013.01); *Y02E 10/541* (2013.01); *H01L 31/0749* (2013.01); *H01L 31/036* (2013.01); *H01L 31/0465* (2014.12)

(58) Field of Classification Search
CPC ................................................... H01L 31/0322
See application file for complete search history.

(56) References Cited

U.S. PATENT DOCUMENTS 5,678,094 A   10/1997   Kotani et al.
6,023,020 A   2/2000    Nishitani et al.

FOREIGN PATENT DOCUMENTS

JP   H5-24884 A    2/1993
JP   H7-211927 A   8/1995
(Continued)

OTHER PUBLICATIONS

"Interfacial layer formation between Cu (In, Ga) Se 2 and In x S y layers," D. Abou Ras et al., J. Appl. Phys. 98, 123512 (2005).*
(Continued)

*Primary Examiner* — Thao X Le
*Assistant Examiner* — Xia L Cross
(74) *Attorney, Agent, or Firm* — Procopio, Cory, Hargreaves & Savitch LLP

(57) ABSTRACT

A photoelectric conversion device includes a light-absorbing layer including a compound semiconductor capable of photoelectric conversion, the compound semiconductor containing a group Ib element including Cu, a group IIIb element and a group VIb element; and a semiconductor layer on one surface-side of the light-absorbing layer, the semiconductor layer having a plane orientation different from that of the light-absorbing layer, the semiconductor layer containing a group Ib element including Cu, at least one element selected from Cd, Zn and In, and a group VIb element. The photoelectric conversion device includes a region in which Cu content decreases from the light-absorbing layer to the semiconductor layer across a junction interface.

7 Claims, 9 Drawing Sheets

(51) Int. Cl.
*H01L 31/036* (2006.01)
*H01L 31/0465* (2014.01)

(56) References Cited

FOREIGN PATENT DOCUMENTS

| JP | H8-271960 A | 10/1996 |
|---|---|---|
| JP | H10-117005 A | 5/1998 |
| JP | 2012-079727 A | 4/2012 |

OTHER PUBLICATIONS

"Formation and electronic properties and In2S3/Cu(In,Ga)Se2 junctions and related thin film solar cells," P. Pistor, PhD dissertation, 2009.*
"Chemical bath deposition of indium sulphide thin films: preparation and characterization," C. D. Lokhande et al., Thin Solid Films, 340 (1999), pp. 18-23.*
Office Action dated Jul. 15, 2014 issued in corresponding Japanese application No. 2013-518134.
International Preliminary Report on Patentability dated on Dec. 12, 2013, issued for International Application No. PCT/JP2012/063978.
International Search Report dated Jun. 26, 2012, issued for International Application No. PCT/JP2012/063978.
Extended European Search Report dated Oct. 30, 2014, issued by the European Patent Office for Counterpart European Application No. EP 12 79 3480.
Abou-Ras D et al., "Interfacial layer formations between Cu(In, Ga)Se2 and InxSy layers", Journal of Applied Physics 98, Dec. 27, 2005, pp. 123512-1-123512-7, American Institute of Physics, College Park, MD, USA.
Wada, T. et al., "High-efficiency CIGS solar cells with modified CIGS surface", Solar Energy Materials & Solar Cells 67, 2001, pp. 305-310, Elsevier Science B.V., Amsterdam, NL.
Abou-Ras D et al., "Microstructural and chemical studies of interfaces between Cu(In, Ga)Se2 and In2S3 layers", Journal of Applied Physics 97, Apr. 5, 2005, pp. 084908-1-084908-8, American Institute of Physics, College Park, MD, USA.
Abou-Ras D et al., "Structural and chemical investigations of CBD- and PVD-CdS buffer layers and interfaces in Cu (In,Ga)Se2-based thin film solar cells", Thin Solid Films 480-481, Dec. 8, 2004, pp. 118-123, Elsevier B.V., Amsterdam, NL.

* cited by examiner

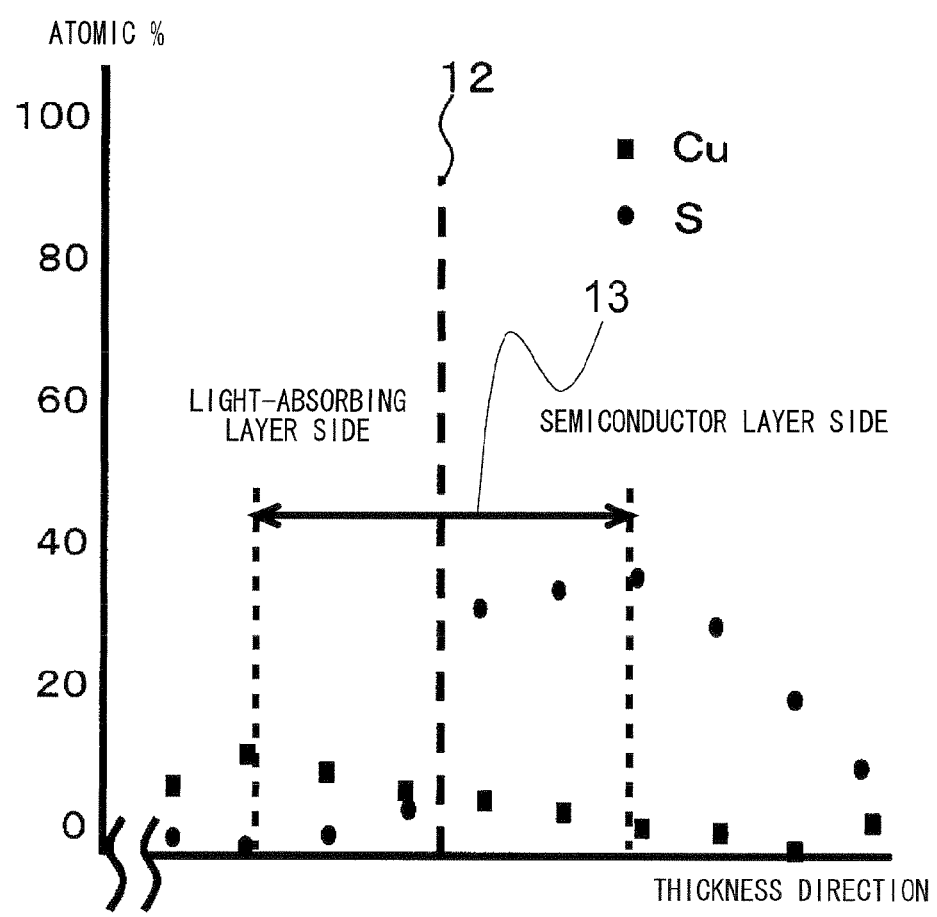
F I G . 3

F I G. 6
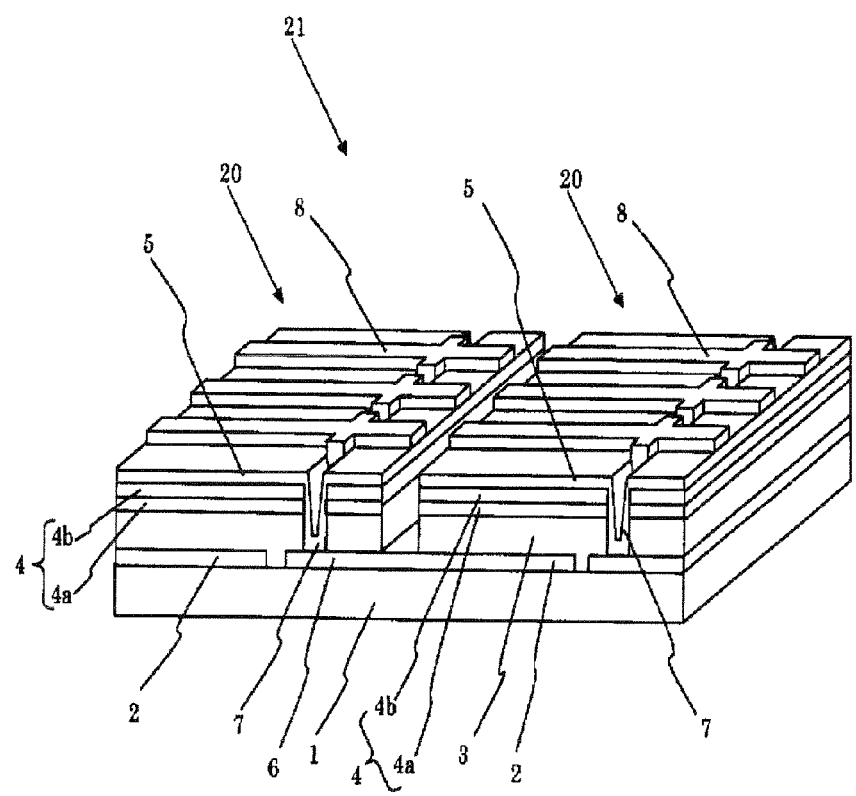

F I G. 8
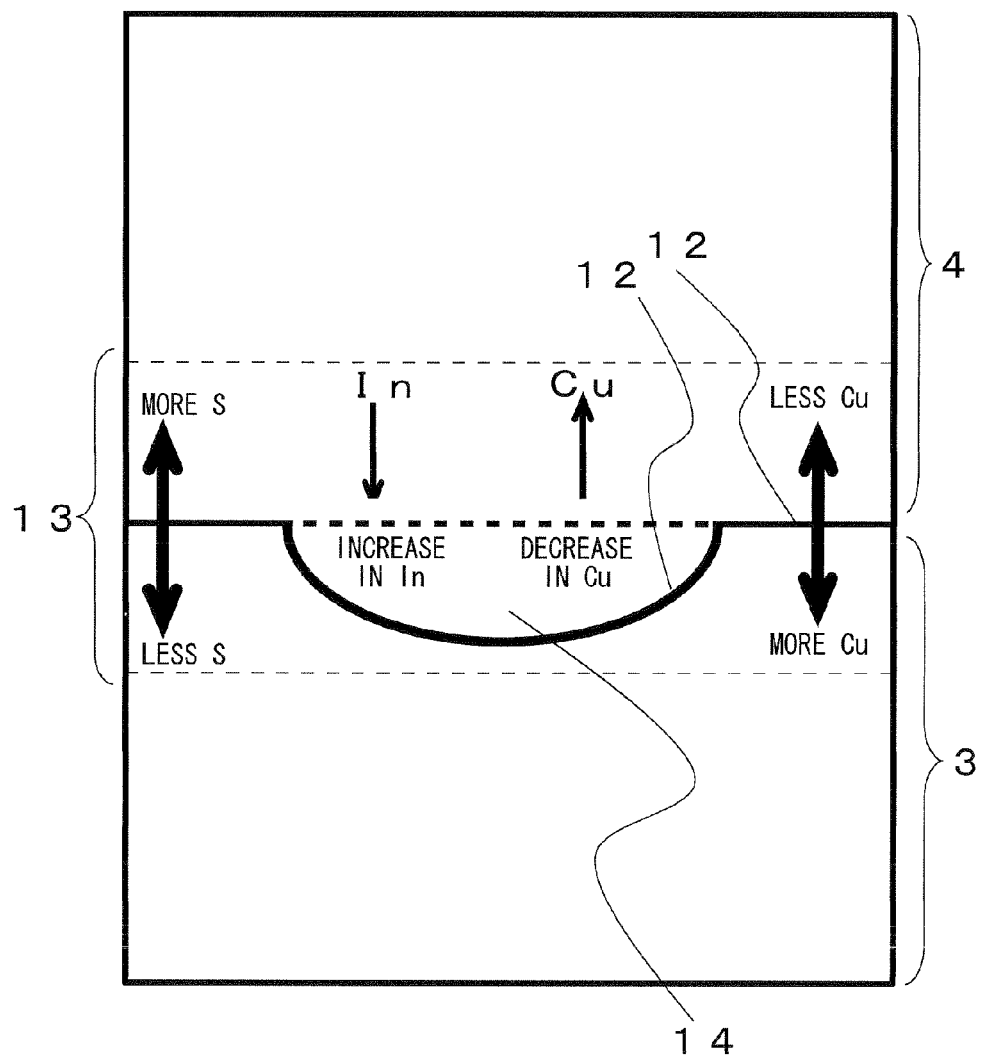

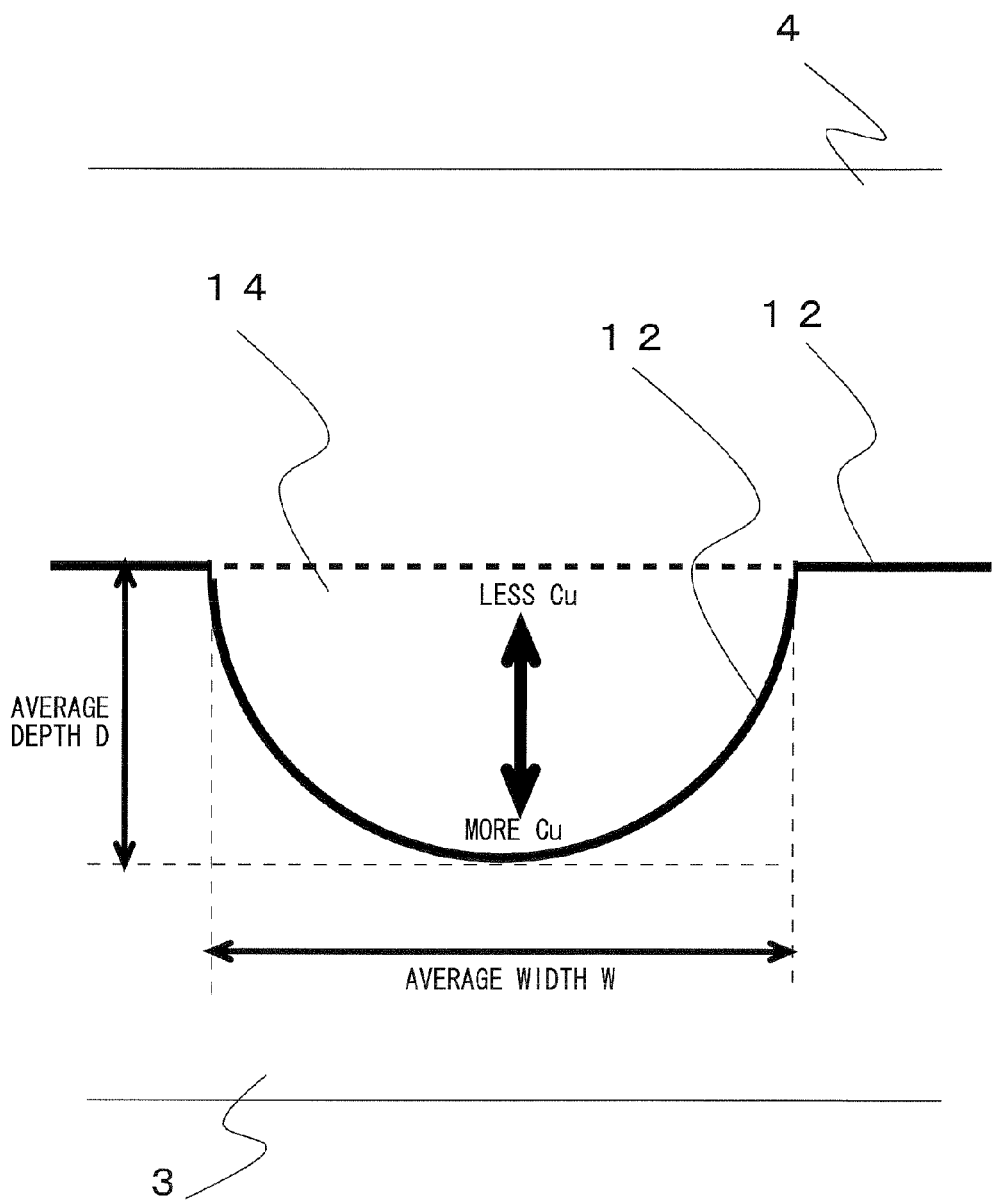

PHOTOELECTRIC CONVERSION DEVICE AND METHOD OF MANUFACTURING PHOTOELECTRIC CONVERSION DEVICE

TECHNICAL FIELD

The present invention relates to a photoelectric conversion device and a method of manufacturing the photoelectric conversion device.

BACKGROUND ART

Photoelectric conversion devices have been required to have higher photoelectric conversion efficiency year after year. Such photoelectric conversion devices include a light-absorbing layer that is a CIS film or a CIGS film. A semiconductor layer that is to be stacked on the light-absorbing layer so as to form an optimal pn junction has been developed.

For example, a method in which a high-resistivity thin film is interposed between the light-absorbing layer and the semiconductor layer in order to control a pn junction at the interface therebetween has been described (See Patent Literature 1).

PRIOR ART DOCUMENT

Patent Literature

Patent Literature 1: Japanese Patent Application Laid-Open No. 10-1170058-271960

SUMMARY OF THE INVENTION

Problem to be Solved by the Invention

However, in the photoelectric conversion device disclosed in Patent Literature 1, the high-resistivity thin film formed in the vicinity of the junction interface between the light-absorbing layer and the semiconductor layer may increase series resistance.

In addition, the high-resistivity thin film interposed between the light-absorbing layer and the semiconductor layer may be a cause of disturbance to a pn junction in the vicinity of the junction interface between the light-absorbing layer and the semiconductor layer.

Thus, it is difficult to consistently manufacture photoelectric conversion devices having high photoelectric conversion efficiency.

Means to Solve the Problem

A photoelectric conversion device of the present invention comprises a light-absorbing layer including a compound semiconductor capable of photoelectric conversion, the compound semiconductor containing a group Ib element including Cu, a group IIIb element and a group VIb element; and a semiconductor layer on one surface-side of the light-absorbing layer, the semiconductor layer having a plane orientation different from that of the light-absorbing layer, the semiconductor layer containing a group Ib element including Cu, at least one element selected from Cd, Zn and In, and a group VIb element. The photoelectric conversion device includes a region in which Cu content decreases from the light-absorbing layer to the semiconductor layer across a junction interface.

A method of manufacturing a photoelectric conversion device of the present invention comprises a light-absorbing layer-forming step in which a light-absorbing layer is formed, the light-absorbing layer including a chalcopyrite-type compound containing a group Ib element including Cu, a group IIIb element and a group VIb element, the light-absorbing layer including a Cu compound other than the chalcopyrite-type compound on a surface-side of the light-absorbing layer; and a thin film-forming step in which a thin film is formed on the light-absorbing layer by a wet deposition method while the light-absorbing layer is immersed in an acid solution or an alkali solution to cause elution of Cu from a surface of the light-absorbing layer, the thin film containing at least one element selected from Cd, Zn and In and a group VIb element.

Effects of the Invention

According to the present invention, the photoelectric conversion device includes a region in which Cu content decreases from the light-absorbing layer to the semiconductor layer across the junction interface. Therefore, the series resistance in the vicinity of the heterojunction interface does not change markedly and thus a photoelectric conversion device having stable conductivity and high photoelectric conversion efficiency can be manufactured.

BRIEF DESCRIPTION OF DRAWINGS

FIG. 3 is a graph showing Cu and S concentration distributions in the vicinity of the heterojunction interface shown in FIG. 2.

FIG. 6 is a perspective view of the embodiment of the photoelectric conversion devices and the photoelectric conversion module according to the present invention shown in FIG. 5.

FIG. 7A is a plan view and FIG. 7B is a cross-sectional perspective view.

FIG. 8 is a schematic cross-sectional view of a Cu-deficient portion in a photoelectric conversion device of an embodiment according to the present invention.

FIG. 9 is an enlarged schematic cross-sectional view of the Cu-deficient portion shown in FIG. 8.

EMBODIMENTS FOR CARRYING OUT THE INVENTION

Hereafter, a photoelectric conversion device according to the present invention and a method of manufacturing the photoelectric conversion device according to the present invention will be described with reference to the attached drawings.

(Photoelectric Conversion Device)

Figure 1:
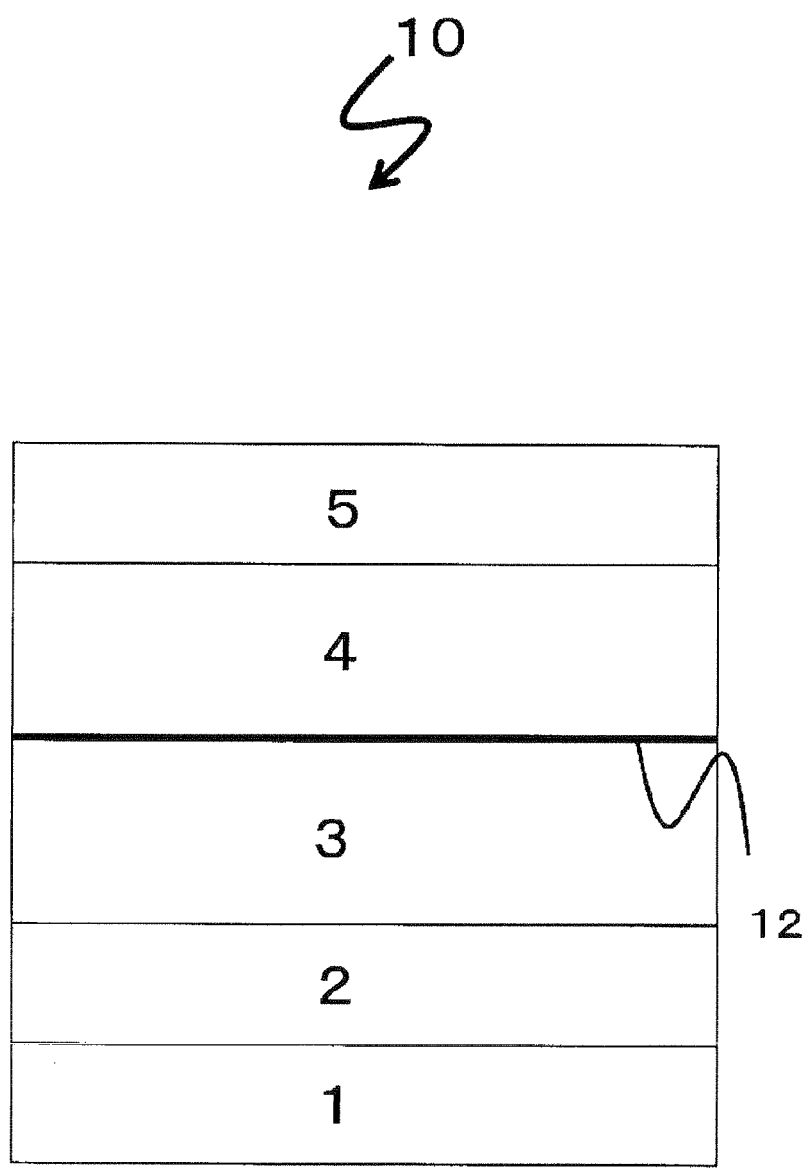
FIG. 1 is a schematic cross-sectional view of a photoelectric conversion device of an embodiment according to the present invention.

As shown in FIG. 1, a photoelectric conversion device 10 includes a substrate 1, a first electrode layer 2, a light-absorbing layer 3, a semiconductor layer 4, and a second electrode layer 5 (hereafter, also referred to as transparent electrode layer 5).

The light-absorbing layer 3 has the function of absorbing light and thereby generating electric charge. A chalcopyrite-type compound semiconductor is used as the light-absorbing layer 3 because high photoelectric conversion efficiency is realized even when the light-absorbing layer 3 has a small thickness of 10 μm or less.

Examples of the chalcopyrite-type compound semiconductor include $Cu(In, Ga)Se_2$ (also referred to as CIGS), $Cu(In, Ga)(Se, S)_2$ (also referred to as CIGSS), and $CuInS_2$ (also referred to as CIS). $Cu(In, Ga)Se_2$ is a compound mainly comprised of Cu, In, Ga, and Se. $Cu(In, Ga)(Se, S)_2$ is a compound mainly comprised of Cu, In, Ga, Se, and S.

In FIG. 1, the semiconductor layer 4 is a layer forming a heterojunction with the light-absorbing layer 3.

The semiconductor layer 4 is formed on the light-absorbing layer 3 and has a thickness of about 5 to 200 nm. The light-absorbing layer 3 and the semiconductor layer 4 preferably have different conductivity types from each other. For example, in the case where the light-absorbing layer 3 is a p-type semiconductor, the semiconductor layer 4 is an n-type semiconductor. The semiconductor layer 4 is preferably a layer having a resistivity of 1 Ω·cm or more in order to reduce leakage current. The semiconductor layer 4 preferably has optical transparency in the wavelength range of light absorbed by the light-absorbing layer 3 in order to increase the absorption efficiency of the light-absorbing layer 3.

The semiconductor layer 4 preferably includes a compound of a group IIb element (e.g., Cd or Zn) or a group IIIb element (e.g., In) with a chalcogen (e.g., O, S, Se, or Te).

Specific examples of such a compound include CdS, ZnS, ZnO, $In_2S_3$, $In_2Se_3$, and $In_2Te_3$. In particular, $In_2S_3$, $In_2Se_3$, and $In_2Te_3$ have high durability and are less susceptible to degradation in a high-temperature, high-humidity environment. Therefore, both the high durability and high photoelectric conversion efficiency in a high-temperature, high-humidity environment are realized by stacking such a semiconductor layer 4 on the light-absorbing layer 3.

A gradient of the concentration of a specific element is present between the light-absorbing layer 3 and the semiconductor layer 4, which will be described below.

Moreover, even when a large-sized photoelectric conversion device 10 is formed, in-plane variation of the above-described durability and photoelectric conversion efficiency can be suppressed. Thus, the size of a photoelectric conversion device 10 having high durability and a good photoelectric conversion property can be increased.

The thickness of the semiconductor layer 4 is preferably 5 to 100 nm.

When the thickness of the semiconductor layer 4 is within the above-described range, band matching between the semiconductor layer 4 and the light-absorbing layer 3 is improved, and thus a charge-separation function of the photoelectric conversion portion constituted by the light-absorbing layer 3 and the semiconductor layer 4 can be enhanced.

Figure 4:
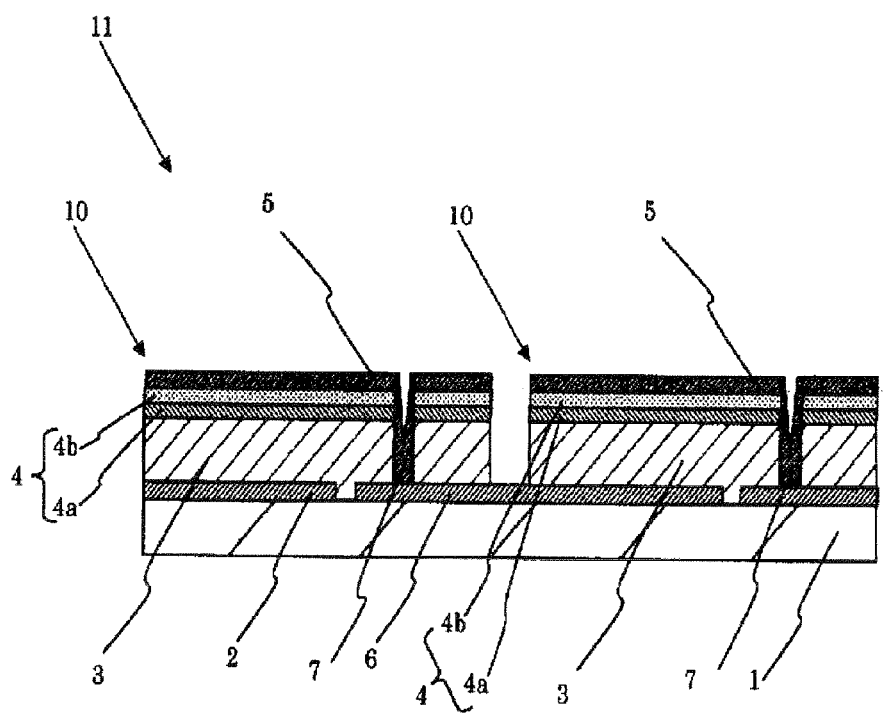
FIG. 4 is a cross-sectional view showing an example of an embodiment of a photoelectric conversion devices and photoelectric conversion module according to the present invention.

As shown in FIG. 4, a plurality of the photoelectric conversion devices 10 are arranged sequentially.

Each photoelectric conversion device 10 includes a third electrode layer 6 spaced apart from the first electrode layer 2 and formed on the substrate 1-side of the light-absorbing layer 3. The transparent electrode layer 5 and the third electrode layer 6 are electrically connected to each other with a connection conductor 7 formed in the light-absorbing layer 3. The third electrode layer 6 is integrated with a first electrode layer 2 of the adjoining photoelectric conversion device 10. Thus, the adjoining photoelectric conversion devices 10 are connected to each other in series. In each photoelectric conversion device 10, the connection conductor 7 is formed so as to penetrate the light-absorbing layer 3 and the semiconductor layer 4, and photoelectric conversion is carried out in the light-absorbing layer 3 and the semiconductor layer 4 that are interposed between the first electrode layer 2 and the transparent electrode layer 5.

Figure 5:
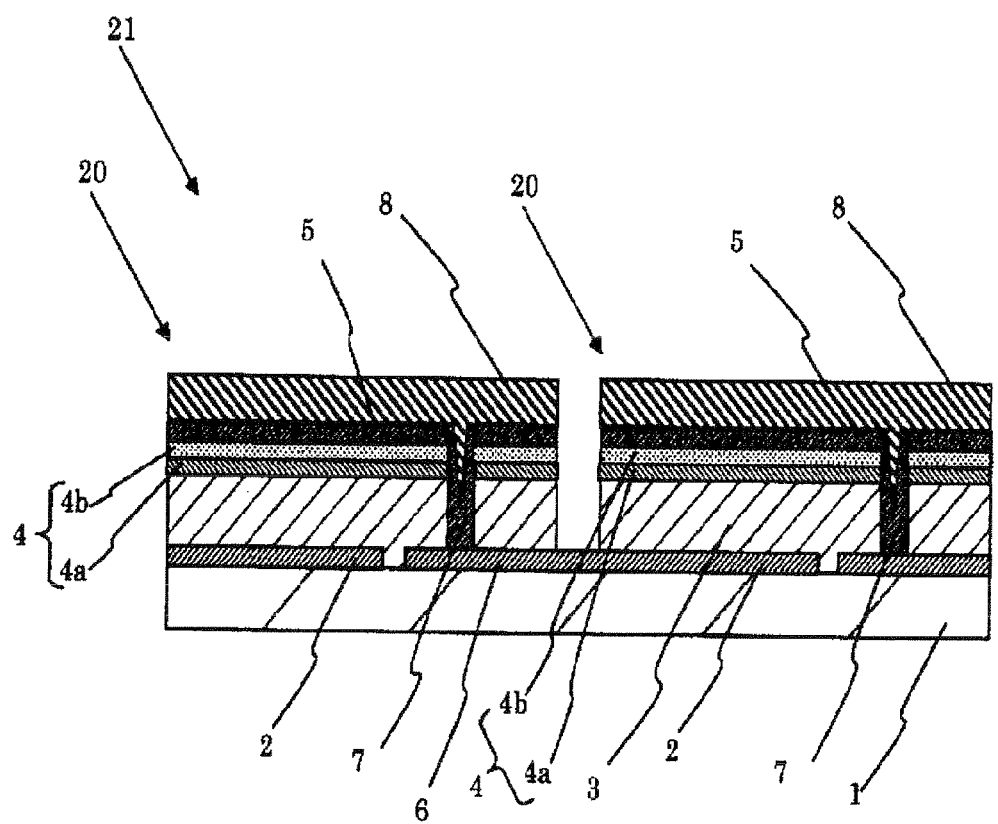
FIG. 5 is a cross-sectional view showing another example of an embodiment of photoelectric conversion devices and a photoelectric conversion module according to the present invention.

Although the semiconductor layer 4 shown in FIG. 1 has a single-layer structure, alternatively, a two-layered structure constituted by a first semiconductor layer 4a and a second semiconductor layer 4b that have different compositions from each other may be employed as shown in FIGS. 4 to 6.

In FIG. 4, the substrate 1 supports the photoelectric conversion device 10. Examples of the material of the substrate 1 include glass, ceramic, resin, and metal.

In FIG. 4, the first electrode layer 2 and the third electrode layer 6 are comprised of a conductive material such as Mo, Al, Ti, or Au and formed on the substrate 1 by a sputtering method, a vapor deposition method, or the like.

In FIG. 4, the second electrode (transparent electrode layer) 5 is a transparent conductive film comprised of ITO, ZnO, or the like having a thickness of 0.05 to 3 μm. The transparent electrode layer 5 is formed by a sputtering method, a vapor deposition method, a chemical vapor deposition (CVD) method, or the like. The transparent electrode layer 5 is a layer having a smaller resistivity than the semiconductor layer 4, and electric charge generated in the light-absorbing layer 3 is extracted through the transparent electrode layer 5. The resistivity of the transparent electrode layer 5 is preferably less than 1 Ω·cm and the sheet resistance of the transparent electrode layer 5 is preferably 50Ω/□ or less in order to satisfactorily extract the electric charge through the transparent electrode layer 5. The transparent electrode layer 5 is preferably transparent to light absorbed by the light-absorbing layer 3 in order to increase the absorption efficiency of the light-absorbing layer 3. The thickness of the transparent electrode layer 5 is preferably 0.05 to 0.5 μm in order to enhance a light-reflection-loss prevention effect and a light-scattering effect as well as optical transparency and in order to satisfactorily transmit current generated by photoelectric conversion. The transparent electrode layer 5 and the semiconductor layer 4 preferably have the same refractive index as each other in order to prevent light-reflection loss from occurring at the junction interface between the transparent electrode layer 5 and the semiconductor layer 4.

Next, another embodiment of a photoelectric conversion device of the present invention is described with reference to FIGS. 5 and 6.

FIG. 5 is a cross-sectional view of the photoelectric conversion device 20 as another embodiment of the present invention. FIG. 6 is a perspective view of the photoelectric conversion device 20. The photoelectric conversion device 20 shown in FIGS. 5 and 6 is different from the photoelectric conversion device 10 shown in FIG. 4 in that a collector electrode 8 is formed on the transparent electrode layer 5. In FIGS. 5 and 6, the same portions as in FIG. 4 are given the same reference numerals, and a plurality of the photoelectric conversion devices 20 are connected to one another to form a photoelectric conversion module 21 as in the photoelectric conversion device 10 shown in FIG. 4.

Hereafter, an embodiment of the photoelectric conversion device of the present invention and another embodiment of the photoelectric conversion device of the present invention will be described in detail.

The photoelectric conversion device of the present embodiment includes a light-absorbing layer including a compound semiconductor capable of photoelectric conversion, the compound semiconductor containing a group Ib element including Cu, a group IIIb element, and a group VIb element; and a semiconductor layer on one surface-side of the light-absorbing layer, the semiconductor layer having a plane orientation different from that of the light-absorbing layer, the semiconductor layer containing a group Ib element including Cu, at least one element selected from Cd, Zn, and In, and a group VIb element. The photoelectric conversion device has a region in which Cu content decreases from the light-absorbing layer to the semiconductor layer across a junction interface.

As described above, examples of the material of the semiconductor layer 4 on the light-absorbing layer 3 include chalcogenides of a group IIb element or a group IIIb element (e.g., CdS, ZnS, ZnO, In2S3, In2Se3, In2Te3 and the like). In the following description, In2S3 is used.

Figure 2:
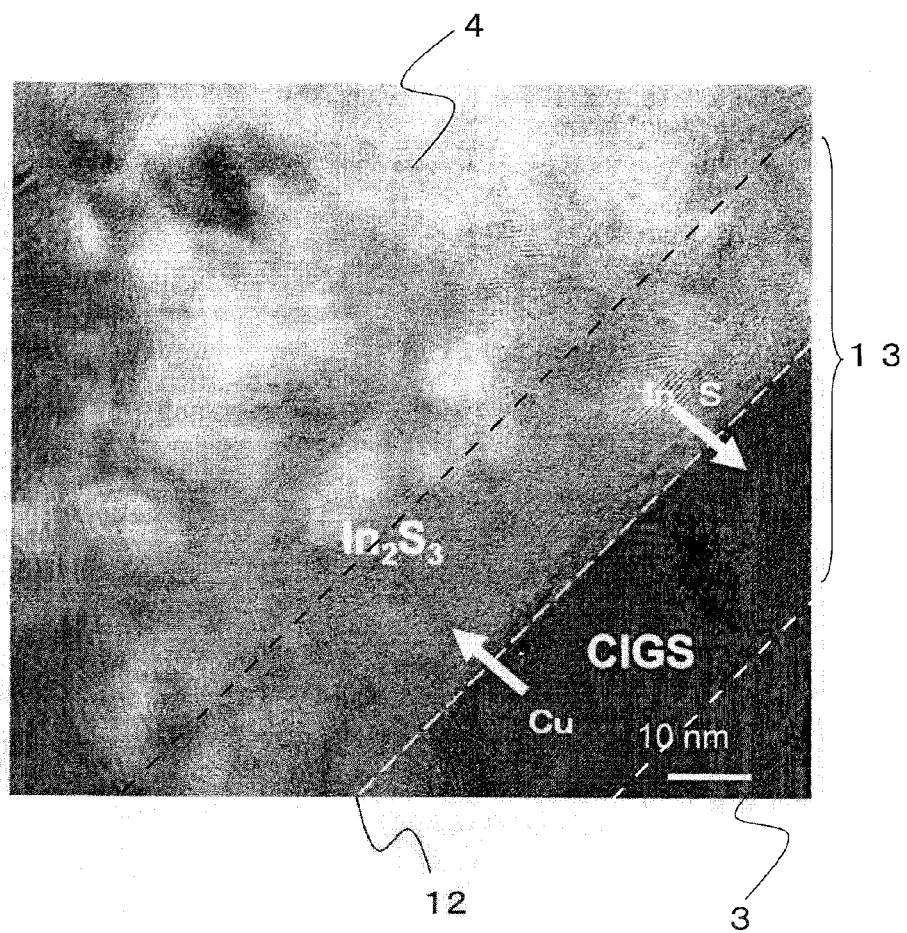
FIG. 2 is a photograph as a substitute for a drawing, which shows a portion in the vicinity of a heterojunction interface between a light-absorbing layer and a semiconductor layer of a photoelectric conversion device of an embodiment according to the present invention.

FIG. 2 is a TEM image taken in the vicinity of a heterojunction interface 12 between the light-absorbing layer 3 and the semiconductor layer 4. The light-absorbing layer 3 and the semiconductor layer 4 have different plane orientations from each other, thus being distinguished from each other by the heterojunction interface 12 shown as a broken line.

The arrow in the upper-left direction in FIG. 2 means that, during the manufacturing process described below, a portion of Cu eluted from the light-absorbing layer 3 is embedded into the semiconductor layer 4 and, on the other hand, a portion of In constituting the semiconductor layer 4 is embedded into a site in the light-absorbing layer 3 from which Cu is removed.

IN the case where the semiconductor layer 4 is comprised of CdS or ZnS, a portion of Cd or Zn is embedded into the site in the light-absorbing layer 3 from which Cu is removed.

Also, the arrow in the lower-right direction in FIG. 2 means that a portion of S is removed from the semiconductor layer 4 and then embedded throughout the entire surface of the light-absorbing layer 3.

FIG. 3 is a graph showing Cu distribution and S distribution extending from the semiconductor layer 4-side to the light-absorbing layer 3-side across the heterojunction interface 12 shown in FIG. 2.

As shown in FIGS. 2 and 3, the result of a quantitative analysis in atomic % in thickness direction indicates the presence of a region 13 in which Cu content decreases from the inside of the light-absorbing layer 3 to the heterojunction interface 12 and still decreases from the heterojunction interface 12 to the inside of the semiconductor layer 4.

This prevents Cu content that has the most dominant influence on conductivity from being markedly changed in the vicinity of the heterojunction interface 12 between the light-absorbing layer 3 and the semiconductor layer 4. Thus, series resistance is prevented from being markedly changed locally in the vicinity of the heterojunction interface 12.

As a result, the current loss in the vicinity of the heterojunction interface 12 between the light-absorbing layer 3 and the semiconductor layer 4 is reduced, which increases the photoelectric conversion efficiency.

It is sufficient that the tendency that the Cu content decreases from the light-absorbing layer 3 to the semiconductor layer 4 across the heterojunction interface 12 between the light-absorbing layer 3 and the semiconductor layer 4 can be confirmed. Even if Cu content is increasing locally inside the light-absorbing layer 3 or the semiconductor layer 4, the increase in Cu content has little influence on the photoelectric conversion efficiency.

The CIGS (light-absorbing layer 3) shown in FIGS. 2 and 3 includes Se (e.g., Cu(In, Ga)Se$_2$ and the like) as a group VIb element.

In the photoelectric conversion device of the embodiment, a Cu-deficient portion is present locally in the one surface-side of the light-absorbing layer. The Cu-deficient portion has a high content of the at least one element selected from Cd, Zn, and In and a low content of Cu.

Figure 7A:
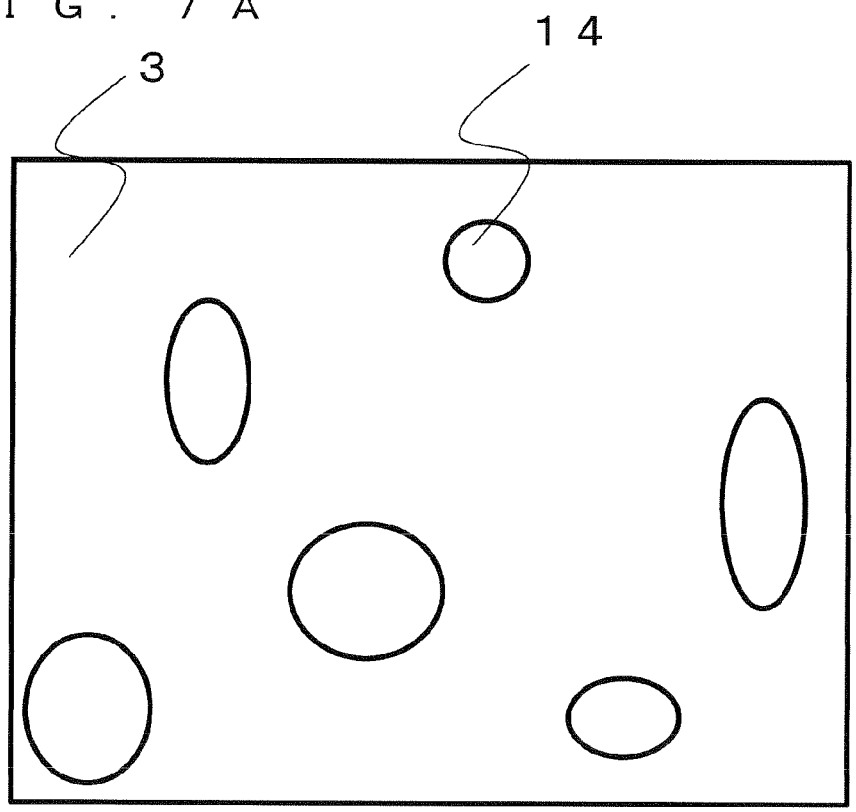
FIGS. 7A and 7B include schematic diagrams illustrating a heterojunction interface of a photoelectric conversion device of an embodiment according to the present invention, where
Figure 7B:
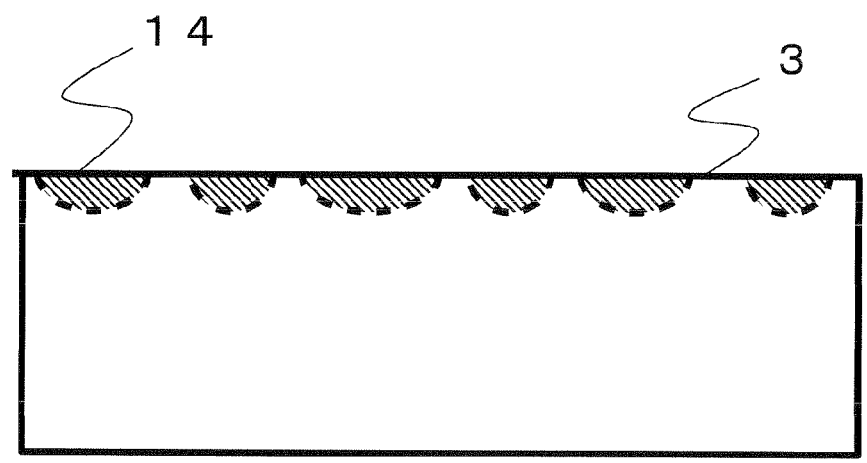

As shown FIGS. 7A, 7B and 8, the Cu-deficient portion 14 is a portion that has a relatively low Cu content on the surface-side of the light-absorbing layer 3 and that has a high content of at least one element selected from Cd, Zn, and In.

As shown in FIG. 8, unstable Cu is removed from the surface of the light-absorbing layer 3 and then replaced with the at least one element selected from the Cd, Zn, and In removed from the semiconductor layer 4 (e.g., CdS, ZnS, ZnO, In$_2$S$_3$, In$_2$Se$_3$, In$_2$Te$_3$ and the like). As a result, the area of the heterojunction interface 12 substantially increases, which increases photoelectric conversion efficiency.

The composition of the Cu-deficient portion 14 in the surface of the light-absorbing layer 3 is, for example, CuIn$_3$Se$_5$. The composition of portions other than the Cu-deficient portion 14 is, for example, Cu(In, Ga)Se$_2$.

The Cu-deficient portions 14 are preferably dispersed more finely throughout the surface of the light-absorbing layer 3 and more deeply from the surface of the light-absorbing layer 3 and preferably has a larger occupancy ratio in the surface of the light-absorbing layer 3 in order to substantially increase the area of the heterojunction interface 12.

Note that the important thing is not to just simply increase the area of the junction interface 12 between the semiconductor layer 4 and the light-absorbing layer 3, but to increase the area of the junction interface 12 at which a heterojunction is substantially formed.

Therefore, the photoelectric conversion efficiency cannot be increased by just simply increasing the surface roughness of the light-absorbing layer 3.

This is because, when a light-absorbing layer 3 having a certain surface roughness is used, the area of the heterojunction interface 12 can be increased more when the incomplete Cu compound is more abundantly present in the surface of the light-absorbing layer 3 as in the present invention.

The heterojunction interface 12 in the Cu-deficient portion 14 is the solid line shown in FIGS. 8 and 9.

As shown in FIG. 9, Cu content decreases from the light-absorbing layer 3 to the semiconductor layer 4 even inside the Cu-deficient portion 14.

This is the same tendency as in a part of the region 13 outside the Cu-deficient portion 14 in which Cu content decreases from the light-absorbing layer 3 to the semiconductor layer 4.

In the photoelectric conversion device according to the embodiment, the group VIb element included in the light-absorbing layer 3 includes Se and the group VIb element included in the semiconductor layer 4 includes S, and S content increases from the light-absorbing layer 3 to the semiconductor layer 4 across the junction interface 12.

As shown in FIGS. 2 and 3, when being analyzed in the thickness direction in atomic %, the S content increases from the inside of the light-absorbing layer 3 to the heterojunction interface 12 and still increases from the heterojunction interface 12 to the inside of the semiconductor layer 4.

As a result, a good pn junction is formed at the heterojunction interface 12 between the light-absorbing layer 3 and the semiconductor layer 4, which increases the photoelectric conversion efficiency.

It is sufficient that the tendency that the S content increases from the light-absorbing layer 3 to the semiconductor layer 4 across the heterojunction interface 12 between the light-absorbing layer 3 and the semiconductor layer 4 can be confirmed. Even if the S content is decreasing locally inside the light-absorbing layer 3 or inside the semiconductor layer 4, the decrease in S content has little influence on the photoelectric conversion efficiency.

Note that, in FIG. 3, In distribution is omitted and S distribution is shown.

In the photoelectric conversion device of the present embodiment, the plane orientation of the light-absorbing layer 3 is (112) and the plane orientation of the semiconductor layer 4 is (111).

This allows the densities of the light-absorbing layer 3 and the semiconductor layer 4 to be easily controlled to be substantially equal to each other and thereby prevents the absolute amounts of Cu and S from markedly varying across the heterojunction interface 12.

Although the plane orientation of the light-absorbing layer 3 is (112) and the plane orientation of the semiconductor layer 4 is (111) in this embodiment, a plane orientation other than (112) may be present on the light-absorbing layer 3 as long as the densities of the light-absorbing layer 3 and the semiconductor layer 4 are substantially equal to each other.

When the (111)-plane of the semiconductor layer 4 is grown on the (112)-plane of the light-absorbing layer 3, the (111)-plane of the semiconductor layer 4 can be observed in a TEM image taken so that the (112)-plane of the light-absorbing layer 3 can be observed.

Thus, the position of the heterojunction interface 12 can be identified as a portion in the vicinity of the boundary of the light-absorbing layer 3 and the semiconductor layer 4 that have different plane orientations from each other.

(Photoelectric Conversion Module)

A photoelectric conversion module of an embodiment of the present invention includes a plurality of photoelectric conversion devices 10 and is formed by electrically connecting each of the photoelectric conversion devices 10 to the adjoining photoelectric conversion device 10. In other words, a photoelectric conversion module 11 can be prepared by sequentially arranging a plurality of the photoelectric conversion devices 10 and then electrically connecting the plurality of the photoelectric conversion devices 10 to one another.

In order to easily connect the adjoining photoelectric conversion devices 10 to one another in series, as shown in FIG. 4, each photoelectric conversion device 10 includes a third electrode layer 6 formed on the substrate 1-side of a light-absorbing layer 3 so as to be spaced apart from a first electrode layer 2. A transparent electrode layer 5 and the third electrode layer 6 are electrically connected to each other with a connection conductor 7 formed on the light-absorbing layer 3.

The connection conductor 7 is preferably combined with the transparent electrode layer 5 to form a single piece by forming the connection conductor 7 at the same time of forming the transparent electrode layer 5. This allows the manufacturing process to be simplified and reliability of the electrical connection between the connection conductor 7 and the transparent electrode layer 5 to be enhanced. The connection conductor 7 connects between the transparent electrode layer 5 and the third electrode layer 6 and thereby allows each of the adjoining light-absorbing layers 3 to satisfactorily perform photoelectric conversion. As a result, current can be extracted through the connection conductor 7 in a series connection.

In the photoelectric conversion device of the present embodiment, the region in which Cu content decreases from the light-absorbing layer 3 to the semiconductor layer 4 across the junction interface 12 is a region extending 10 nm or more from the junction interface 12 in a direction perpendicular to the junction interface 12.

In FIG. 8, the region 13 extends at least 10 nm or more from the heterojunction interface 12 to the light-absorbing layer 3-side and at least 10 nm or more from the heterojunction interface 12 to the semiconductor layer 4-side.

This allows Cu to be sufficiently diffused from the light-absorbing layer 3 to the semiconductor layer 4. As a result, an effective heterojunction is realized.

In the photoelectric conversion device of the present embodiment, the Cu-deficient portion 14 has an average width in a direction parallel to the junction interface 12 of 10 to 300 nm in a cross-sectional view of the light-absorbing layer 3 taken in its thickness direction.

In the photoelectric conversion device of the present embodiment, the Cu-deficient portion 14 has an average depth in a direction perpendicular to the junction interface 12 of 10 nm or more in a cross-sectional view of the light-absorbing layer 3 taken in its thickness direction.

In FIG. 9, D and W denote the average depth and the average width, respectively. When the average depth and the average width are within the above-described ranges, the area of the heterojunction interface 12 created by the Cu-deficient portion 14 can be efficiently increased.

In the photoelectric conversion device of the present embodiment, the Cu-deficient portion 14 has an occupancy ratio in the junction interface 12 of 10% or more in a cross-sectional view of the light-absorbing layer 3 taken in its thickness direction.

This maintains the area of the heterojunction interface 12 created by the Cu-deficient portion 14, which increases the photoelectric conversion efficiency.

It may be said in other words, the Cu-deficient portion 14 has an occupancy ratio of 10% or more in the heterojunction interface 12 in a perspective plan view of the light-absorbing layer 3 viewed from the semiconductor-layer 4-side.

In the observation of the Cu-deficient portion 14, color mapping of the portion in the vicinity of the heterojunction interface 12 (region 13) on a TEM image allows a qualitative, quantitative observation to be easily made.

(Method of manufacturing Photoelectric Conversion Device)

Next, the method of manufacturing the photoelectric conversion device of an embodiment of the present invention is described.

A method of manufacturing a photoelectric conversion device of the present embodiment includes a light-absorbing layer-forming step in which a light-absorbing layer is formed, the light-absorbing layer including a chalcopyrite-type compound containing a group Ib element including Cu, a group IIIb element, and a group VIb element, the light-absorbing layer including a Cu compound other than the chalcopyrite-type compound on a surface-side of the light-absorbing layer; and a thin film-forming step in which a thin film is formed on the light-absorbing layer by a wet deposition method while the light-absorbing layer is immersed in an acid solution or an alkali solution to cause elution of Cu from a surface of the light-absorbing layer, the thin film containing at least one element selected from Cd, Zn, and In and a group VIb element.

In the light-absorbing layer-forming step, the light-absorbing layer 3 comprised of a semiconductor may be formed by depositing a raw-material element by sputtering or vapor deposition in the form of a film or applying a raw-material solution in the form of a film to form a precursor containing the raw-material element and then heating the precursor.

In another case, the light-absorbing layer 3 may be formed by forming, as a precursor, a film comprised of a metal element in the same manner as described above and then heating the precursor in a gas atmosphere containing a group VIb element.

The method for forming the Cu compound other than the chalcopyrite-type compound on the surface-side of the light-absorbing layer 3 is not particularly limited.

The Cu compound other than the chalcopyrite-type may be formed by, for example, mixing of the Cu compound other than the chalcopyrite-type near the final stage of the light-absorbing layer-forming step.

Specifically, a layer comprised of the Cu compound other than the chalcopyrite-type compound may be formed by mixing of a precursor containing $Cu^{+1}$ such as copper hexafluoroacetylacetonate and then heating the resulting mixture at 100° C. to 600° C.

In the thin film-forming step in which the semiconductor layer 4 is formed, a wet deposition method is employed.

The wet deposition method used herein is a method in which a raw-material solution is applied to the light-absorbing layer 3 and then subjected to a heat treatment or the like to cause a chemical reaction or a method in which precipitation is performed on the light-absorbing layer 3 by a chemical reaction in a solution containing a raw material.

Since unreacted Cu and a Cu compound having an unstable composition are present as the Cu compound other than the chalcopyrite-type compound on the surface of the light-absorbing layer 3, Cu is caused to be easily eluted preferentially from the surface of the light-absorbing layer 3 due to the reaction with an acid solution or an alkali solution in the early stage of the thin film-forming step.

Therefore, porous holes are finely formed on the surface of the light-absorbing layer 3. Cu is considered to be eluted more easily through the holes.

When the thin film containing at least one element selected from Cd, Zn, and In and a group VIb element is formed by a wet deposition method while Cu is eluted in an acid solution or an alkali solution as described above, the semiconductor layer 4 is formed while incorporating the eluted Cu into the thin film.

Finally, Cu content in the surface of the light-absorbing layer 3 becomes smaller than that in the entire portion of the light-absorbing layer 3. As a result, there is a tendency that Cu content decreases from the light-absorbing layer 3 to the semiconductor layer 4 across the junction interface 12.

DESCRIPTION OF REFERENCE NUMERALS

1: substrate
2: first electrode layer
3: light-absorbing layer
4: semiconductor layer
4a: first semiconductor layer
4b: second semiconductor layer
5: second electrode layer (transparent electrode layer)
6: third electrode layer
7: connection conductor
8: collector electrode
10: photoelectric conversion device
11: photoelectric conversion module
12: junction interface (heterojunction interface)
13: region
14: Cu-deficient portion
20: photoelectric conversion device
21: photoelectric conversion module

The invention claimed is:

1. A photoelectric conversion device comprising:
a light-absorbing layer including a compound semiconductor capable of photoelectric conversion, the compound semiconductor containing a group Ib element including Cu, a group IIIb element and a group VIb element; and
a semiconductor layer on one surface-side of the light-absorbing layer, the semiconductor layer having a plane orientation different from that of the light-absorbing layer, the semiconductor layer containing a group Ib element including Cu, at least one element selected from Cd, Zn and In, and a group VIb element,
wherein the photoelectric conversion device includes
a region in which Cu content decreases from the light-absorbing layer to the semiconductor layer across a junction interface; and
a plurality of Cu-deficient portions which are present at mutual intervals and a remaining portion other than the Cu-deficient portions are present in the one surface-side of the light-absorbing layer, the Cu-deficient portions including a higher content of the at least one element selected from Cd, Zn, and In than the remaining portion and a lower content of Cu than the remaining portion.

2. The photoelectric conversion device according to claim 1, wherein the group VIb element included in the light-absorbing layer includes Se and the group VIb element included in the semiconductor layer includes S, wherein S content increases from the light-absorbing layer to the semiconductor layer across the junction interface.

3. The photoelectric conversion device according to claim 1, wherein the light-absorbing layer has a plane orientation of (112) and the semiconductor layer has a plane orientation of (111).

4. The photoelectric conversion device according to claim 1, wherein the region extends 10 nm or more from the junction interface in a direction perpendicular to the junction interface.

5. The photoelectric conversion device according to claim 1, wherein the Cu-deficient portion has an average width in a direction parallel to the junction interface of 10 to 300 nm in a cross-sectional view of the light-absorbing layer taken in its thickness direction.

6. The photoelectric conversion device according to claim 1, wherein the Cu-deficient portion has an average depth in a direction perpendicular to the junction interface of 10 nm or more in a cross-sectional view of the light-absorbing layer taken in its thickness direction.

7. The photoelectric conversion device according to claim 1, wherein the Cu-deficient portion has an occupancy ratio in the junction interface of 10% or more in a cross-sectional view of the light-absorbing layer taken in its thickness direction.

* * * * *